United States Patent [19]

Shirai et al.

[11] Patent Number: 5,008,724
[45] Date of Patent: Apr. 16, 1991

[54] SEMICONDUCTOR DEVICE

[75] Inventors: Koji Shirai, Kawasaki; Ken Kawamura, Yokohama, both of Japan

[73] Assignee: Kabushiki Kaisha Toshiba, Kawasaki, Japan

[21] Appl. No.: 547,361

[22] Filed: Jul. 3, 1990

Related U.S. Application Data

[62] Division of Ser. No. 160,764, Feb. 26, 1988.

[30] Foreign Application Priority Data

Feb. 27, 1987 [JP] Japan ................................. 62-44252

[51] Int. Cl.⁵ ...................... H01L 27/01; H01L 29/06
[52] U.S. Cl. .................................. 357/23.13; 357/23.1
[58] Field of Search ............................. 357/23.13, 23.1

[56] References Cited

FOREIGN PATENT DOCUMENTS 0096761  4/1984  Japan ................................. 357/23.13

Primary Examiner—Rolf Hille
Assistant Examiner—Wael Fahmy
Attorney, Agent, or Firm—Finnegan, Henderson, Farabow, Garrett, and Dunner

[57] ABSTRACT

A semiconductor device comprising a semiconductor substrate, a field effect transistor formed in the substrate, and a diode connected to the field effect transistor and formed on the insulation film formed on the substrate. Since the diode is electrically insulated from the substrate by the insulation film, no parasitic PNPN thyristor is formed in the semiconductor substrate. Therefore, a latch-up is prevented from occurring in the semiconductor device.

4 Claims, 3 Drawing Sheets

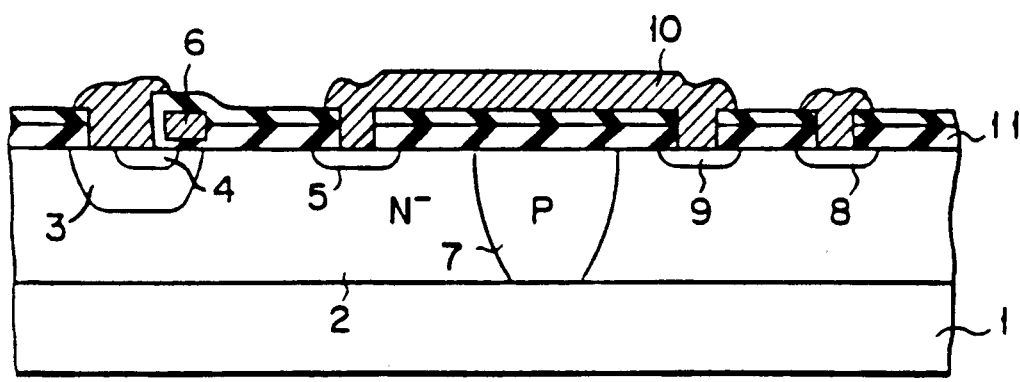
F I G. 1
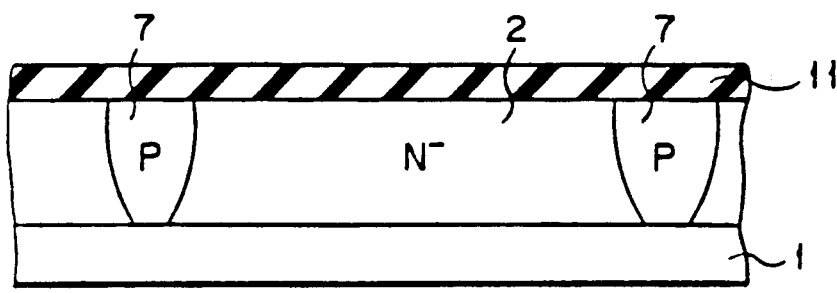
F I G. 2A
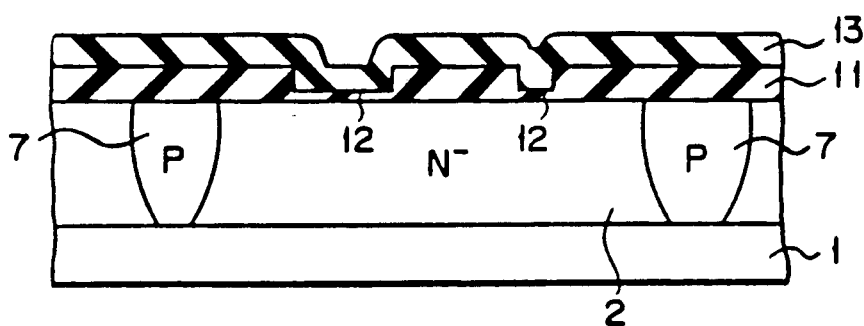
F I G. 2B
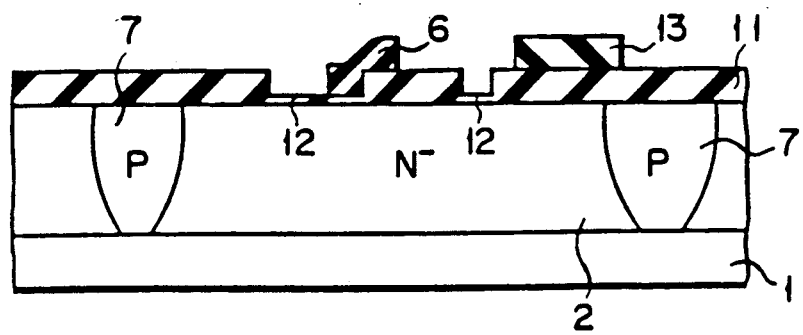
F I G. 2C

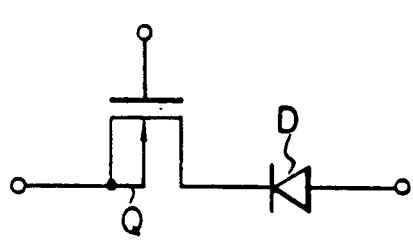
F I G. 3A
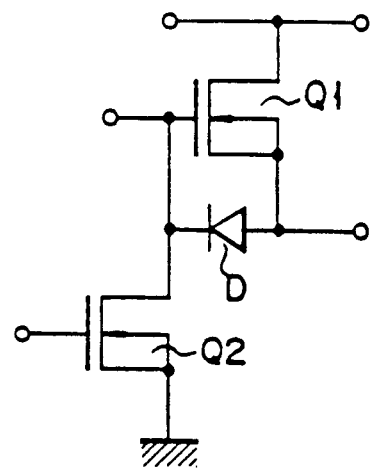
F I G. 3B
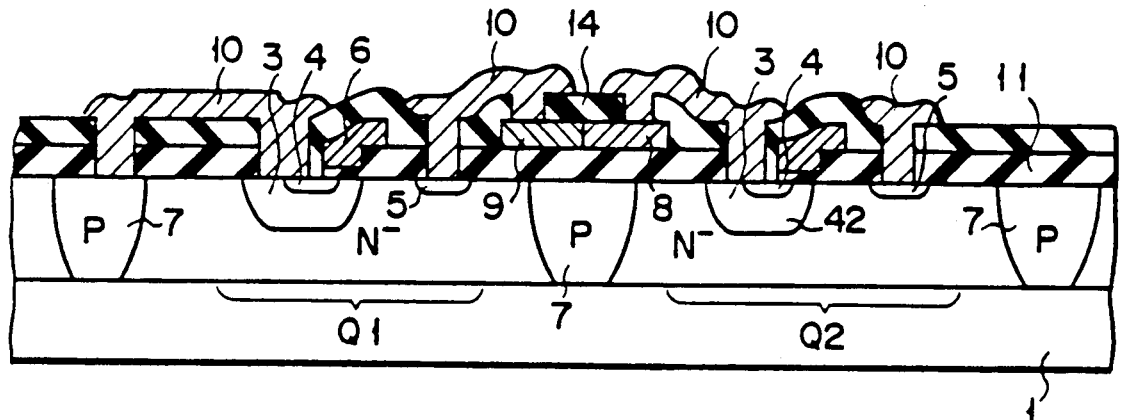
F I G. 4A
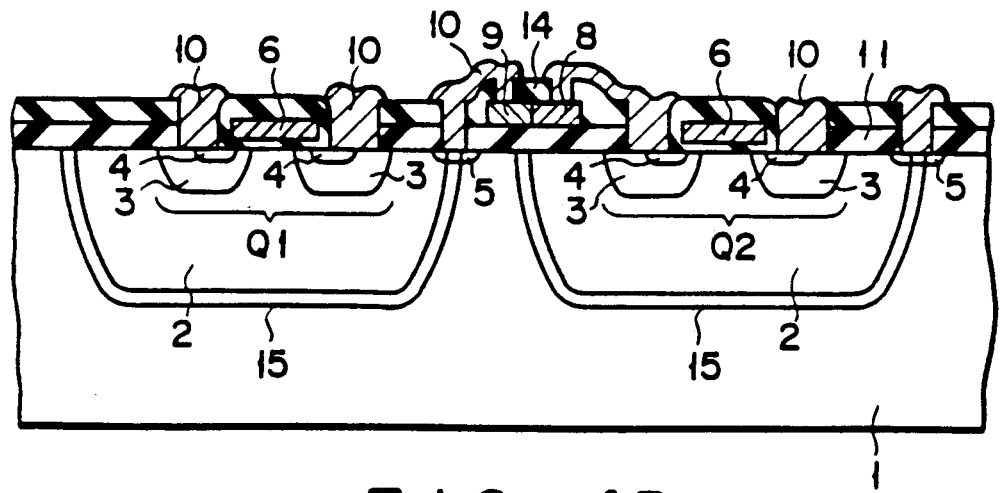
F I G. 4B

SEMICONDUCTOR DEVICE

This is a division of application Ser. No. 160,764, filed Feb. 26, 1988.

BACKGROUND OF THE INVENTION

1. Field of the Invention

The present invention relates to a semiconductor device having a field effect transistor in which a current flows in a specified direction.

2. Description of the Related Art

FIG. 1 is a cross-sectional view of a conventional semiconductor device having a field effect transistor to which a diode is connected, and in which a current flows in a specified direction. This semiconductor device comprises semiconductor substrate 1, N⁻type epitaxial layer 2 formed on substrate 1, and P type element-isolating layer 7 formed on substrate 1 and separating N⁻type epitaxial layer 2 into two portions. A field effect transistor is formed in the first portion of N⁻type epitaxial layer 2. The field effect transistor comprises P-channel region 3 formed in the first portion of epitaxial layer 2, N⁺type source region 4 formed in P-channel region 3, N⁺type drain region 5 in the first portion of epitaxial layer 2, insulation film 11 formed on epitaxial layer 2 and element-isolating layer 7, and gate electrode 6 formed on insulation layer 11 and located above N⁺type source region 4.

A diode is formed in the second portion of N⁻type epitaxial layer 2. This diode comprises N⁺type cathode region 9 and P⁺type anode region 8. N⁺type cathode region 9 is electrically connected by aluminum wire 10 with N⁺type drain region 5 of the field effect transistor.

When a current flows in the forward direction within the semiconductor device shown in FIG. 1, it flows into the drain region 5 of the field effect transistor through P⁺type anode region 9, N⁺type cathode region 8, and aluminum wire 10. Since the field effect transistor and the diode are each formed two epitaxial layers both formed on the same substrate, another current may flow, in some cases, from P⁺type anode region 8 into N⁺type drain region 5 of the field effect transistor through N⁻type epitaxial layer 2 and P type element-isolation layer 7, due to a surge voltage generated when the semiconductor device is switched on or off or when the power-supply voltage of the device varies. In other words, a current may flow through epitaxial layer 5 and isolation layer 7 as if the PNPN thyristor parasitic in this device were turned on. This phenomenon is generally known as "latch up."

Generally it is difficult to prevent a latch-up from taking place within semiconductor devices. When a latch-up occurs in a semiconductor device, heat is generated in the device, destroying the elements formed within the device in some cases.

SUMMARY OF THE INVENTION

It is accordingly the object of this invention to provide a semiconductor device which comprises a field effect transistor and a diode connected to the transistor, and in which a latch-up does not occur.

According to the invention, a field effect transistor is formed in a semiconductor substrate, an insulation layer formed on the substrate, and a diode is formed on the insulation layer and electrically connected to the field effect transistor. Since the diode is formed on the insulation film which in turn is formed on the semiconductor substrate, no parasitic PNPN thyristors are formed within the substrate. Therefore, a latch-up is prevented from occurring in the semiconductor device.

The diode and the field effect transistor are formed at the same time, not in independent processes. Therefore, the semiconductor device of this invention can easily be manufactured. Moreover, no element-isolations need to be formed to isolate the diode and the field effect transistor from each other, and the semiconductor device can, therefore, be comparatively small.

BRIEF DESCRIPTION OF THE DRAWINGS

FIG. 1 is a cross-sectional view of a conventional semiconductor device comprising a semiconductor substrate, a field effect transistor formed in the substrate, and a diode formed in the same substrate and connected to the field effect transistor;

FIGS. 2A to 2F are diagrams explaining how a semiconductor device according to this invention is manufactured;

FIG. 3A is an equivalent circuit diagram of the semiconductor device according to the present invention;

FIG. 3B shows a circuit using the semiconductor device shown in FIG. 3A;

FIG. 4A is a cross-sectional view of a semiconductor device including the circuit shown in FIG. 3B; and FIG. 4B is a cross-sectional view of another semiconductor device including the circuit shown in FIG. 3B.

DETAILED DESCRIPTION OF THE PREFERRED EMBODIMENT

Figure 2D:
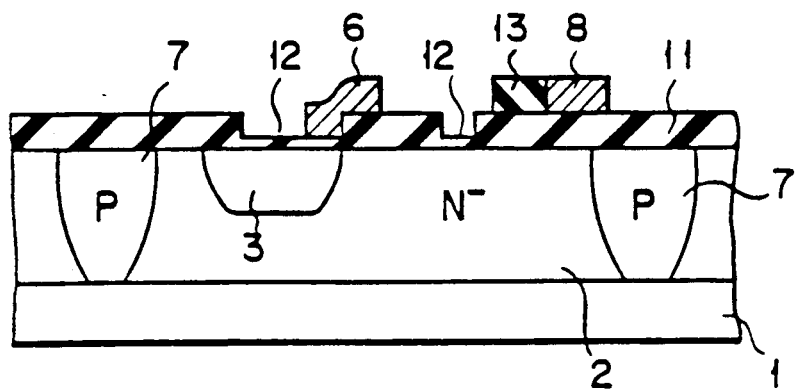

An embodiment of the invention, which is a semiconductor device comprising a double diffused MOS transistor (hereinafter referred to as "DMOS transistor") and a diode connected to the DMOS transistor, is manufactured in the manner illustrated in FIGS. 2A to 2F.

First, N⁻type epitaxial layer 2 is formed on semiconductor substrate 1. Then, element-isolation layer 7 is formed in epitaxial layer 2, as is shown in FIG. 2A. SiO₂ insulation film 11 having a thickness of 7000 Å is formed on expitaxial layer 2 and element-isolating layer 7, by means of steam oxidation carried out at 1000° C. for 60 minutes. As a result, the unfinished product shown in FIG. 2A is obtained.

Two portions of insulation film 11 are removed, thereby exposing those portions of epitaxial layer 2 in which the source and drain regions of DMOS transistor Q will be formed. SiO₂ films 12 having a thickness of 1000 Å are formed on these exposed portions of epitaxial layer 2 by means of steam oxidation performed at 1000° C. for 10 to 15 minutes. Then, polycrystalline silicon layer 13 is formed on SiO₂ insulation film 11 and 12 by means of the CVD method, thereby forming the unfinished product shown in FIG. 2B.

Thereafter, polycrystalline silicon layer 13 is patterned, leaving only those two portions of layer 13 which will be diode D and gate electrode 6 of DMOS transistor Q, respectively. As a result, the structure shown in FIG. 2C is completely formed.

Photo-etching is then applied to the unfinished product. Boron ions are implanted into that portion of epitaxial layer 2 in which the source region of DMOS transistor will be formed, in a dose of 5×10¹³ atom/cm², by applying an acceleration voltage of 60 KeV. Boron ions are also implanted into that portion of polycrystalline silicon layer 13 which will be used as the anode of diode D, also in the dose of 5×10¹³ atom/cm², by applying an acceleration voltage of 60

KeV. The boron, thus ion-implanted, is thermally diffused, whereby a P-channel region 3 is formed in epitaxial layer 2, and P+type anode 8 is formed, as is illustrated in FIG. 2D. P-channel region 3 horizontally extends, with its one end located below gate electrode 6 of DMOS transistor Q.

During the thermal diffusion of boron, the crystal grains of silicon layer 13 grow, the polycrystalline silicon layer 13 changes to almost a single-crystal layer. Hence, the flowing of the leak current which flows when the PN junction of diode D is reversely biased can be reduced.

Figure 2E:
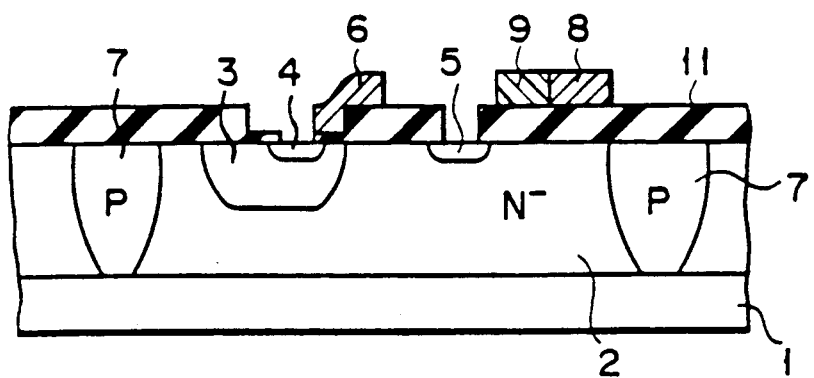

Insulation films 12 are photographically etched, thereby exposing those portions of epitaxial layer 2 in which the source and drain of DMOS transistor Q will be formed. Ions of phosphorus or arsenic are implanted into the exposed portions of layer 2, in the dose of $1 \times 10^{16}$ atom/cm$^2$ by applying an acceleration voltage of 30 KeV. Simultaneously, phosphorus or arsenic ions are implanted into, under the same conditions, polycrystalline silicon layer 6 and that portion of polycrystalline silicon layer 13 which will be used as the cathode of diode D, under the same conditions. The phosporus or arsenic, thus ion-implanted, is thermally diffused, thus forming N+type source region 4, N+type drain region 5, gate electrode 6, and N+type cathode region 9 of diode D. As a result, the unfinished product shown in FIG. 2E is obtained.

Thereafter, SiO$_2$ insulation film 14 having a thickness of 7000 Å is formed on insulation films 11 and 12 by means of the CVD method. The entire structure is then heat-treated. Contact holes are made in insulation film 14, thereby exposing source region 4 and drain region 5 of DMOS transistor Q, and also exposing anode region 8 and cathode region 9 of diode D. An aluminum film is formed on the upper surface of the entire structure, and is then patterned, thereby forming electrodes 10, one of which electrically connects drain region 5 of DMOS transistor Q with cathode region 9 of diode D. Thus, the unfinished product shown in FIG. 2F is obtained.

A passivation film (i.e., a silane coating) is formed on the upper surface of the unfinished product, whereby the semiconductor device of this invention i manufactured. The equivalent circuit of this device is shown in FIG. 3A. As is evident from this figure, the cathode of diode D is coupled to the drain of DMOS transistor Q.

Figure 2F:
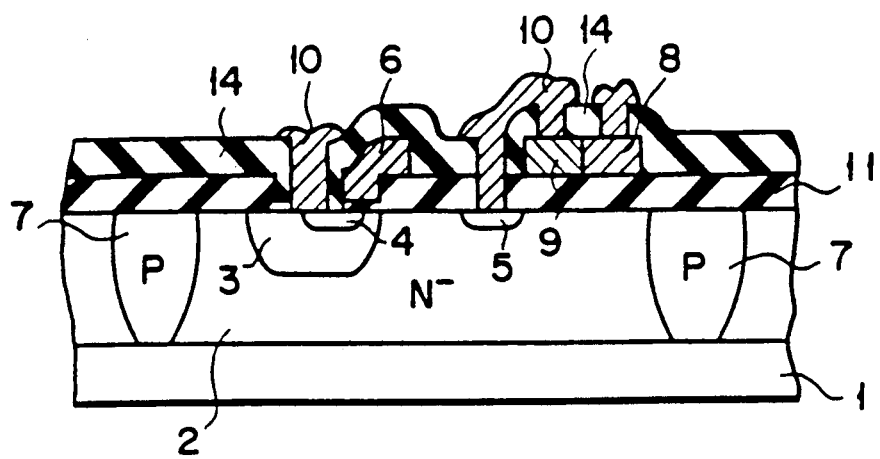

FIG. 3B illustrates a circuit consisting of the device shown in FIG. 2F and DMOS transistor Q2. The anode of diode D is connected to the source of DMOS transistor Q2, and the drain of DMOS transistor Q1 (or Q) is connected to the gate of DMOS transistor Q2. This circuit can be used as a push-pull (bi-directional) output circuit.

FIGS. 4A and 4B are cross-sectional views of semiconductor devices, each using the circuit shown in FIG. 3B. In the device shown in FIG. 4A, drain 5 of DMOS transistor Q is connected to cathode 9 of diode D by means of electrode 10, and source 4 of DMOS transistor Q2 is connected to anode 8 of diode D by means of other electrode 10. In the device shown in FIG. 4B, both DMOS transistors Q1 and Q2 are of a vertical type. Two island regions, each consisting of N+type layer 15 and N−type epitaxial layer 2 formed in layer 15, are formed in semiconductor substrate 1 by the refill epitaxial growth method. Using these island regions, DMOS transistors Q1 and Q2 are formed. As can be understood from FIG. 4B, drain 5 of transistor Q1 is coupled to cathode 9 of diode D by electrode 10, and source 4 of transistor Q2 is connected to anode 8 of diode D by other electrode 10.

Even if a power-supply voltage of 200 V or more is applied to the devices shown in FIGS. 4A and 4B, no latch-up occurs in the push-pull circuits, unlike in the conventional device shown in FIG. 1 wherein the diode is formed in N−type epitaxial layer 2. Thus, the devices illustrated in FIGS. 4A and 4B can operate without making errors even if the power-supply voltage is 200 V or more.

The present invention is not limited to the embodiments described above. Various changes and modifications can be made, so long as the diode connected to the source or drain of a MOS transistor is formed on an insulation film which in turn is formed on a semiconductor substrate.

What is claimed is:

1. A semiconductor device comprising:
   a semiconductor substrate of a first conductivity type;
   an element isolation-layer of a second conductivity type, said element isolation-layer dividing said semiconductor substrate into first and second parts;
   a first field effect transistor formed in the first part of said semiconductor substrate and having a source electrode, a drain electrode, and a gate electrode;
   a second field effect transistor formed in the second part of the semiconductor substrate and having a source electrode, a drain electrode and a gate electrode;
   an insulation film formed on said semiconductor substrate; and
   a diode formed on said insulation film and having an anode electrode and a cathode electrode, said anode electrode being connected to said source electrode of said first field effect transistor and said cathode electrode being connected to said drain electrode of said second field effect transistor.

2. The semiconductor device according to claim 1, wherein said diode and said gate electrodes of said first and second field effect transistors are made of the same material.

3. The semiconductor device according to claim 2, wherein said material is almost single crystal silicon.

4. The semiconductor device according to claim 2, wherein said material is polycrystalline silicon.

* * * * *